(12) United States Patent
Yeo et al.

(10) Patent No.: US 7,023,315 B2
(45) Date of Patent: Apr. 4, 2006

(54) HIGH PERFORMANCE RF INDUCTORS AND TRANSFORMERS USING BONDING TECHNIQUE

(75) Inventors: Kiat Seng Yeo, Singapore (SG); Hai Peng Tan, Singapore (SG); Jianguo Ma, Singapore (SG); Manh Anh Do, Singapore (SG); Kok Wai Johnny Chew, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 219 days.

(21) Appl. No.: 10/448,882

(22) Filed: May 29, 2003

(65) Prior Publication Data

US 2003/0205778 A1 Nov. 6, 2003

Related U.S. Application Data

(62) Division of application No. 09/556,423, filed on Apr. 24, 2000, now Pat. No. 6,586,309.

(51) Int. Cl.
*H01F 5/00* (2006.01)

(52) U.S. Cl. .................. 336/200; 257/531
(58) Field of Classification Search .......... 336/83, 336/200, 232, 206–208; 257/531
See application file for complete search history.

(56) References Cited

U.S. PATENT DOCUMENTS

| | | | | |
|---|---|---|---|---|
| 3,614,554 A | * | 10/1971 | Shield et al. | 257/531 |
| 4,103,267 A | * | 7/1978 | Olschewski | 336/65 |
| 4,777,465 A | * | 10/1988 | Meinel | 336/65 |
| 5,519,533 A | * | 5/1996 | Nomura et al. | 359/478 |
| 5,543,773 A | * | 8/1996 | Evans et al. | 336/183 |
| 5,640,127 A | | 6/1997 | Metz | 330/298 |
| 5,767,563 A | * | 6/1998 | Imam et al. | 257/531 |
| 5,886,393 A | | 3/1999 | Merrill et al. | 257/531 |
| 5,905,418 A | | 5/1999 | Ehara et al. | 333/193 |
| 5,945,880 A | | 8/1999 | Souetinov | 330/311 |
| 5,963,110 A | | 10/1999 | Ihara et al. | 333/28 R |
| 6,194,774 B1 | * | 2/2001 | Cheon | 257/531 |

FOREIGN PATENT DOCUMENTS

| | | |
|---|---|---|
| JP | 10289921 A | 10/1998 |
| WO | WO 00/10179 | 2/2000 |

OTHER PUBLICATIONS

"New Development Trends for Silicon RF Device Technologies," N. Camilleri et al., IEEE Microwave & Millimeter Wave Monolithic Circuits Symposium, pp. 5–8, 1994.
"Future Disections in Silicon IC's for RF Personal Communications," by P.R, Gray et al., Proc. Custom Integrated Circuits Conf., pp. 83–89, 1995.
"High Q CMOS–Compatible Microwave Inductors Using Double–Metal Interconnection Silicon Technology", Min-Park et al., IEEE Microwave & Guilded Wave Letters, vol. 7, No. 2, pp. 45–47, Feb. 1997.
"RF Circuits Design Aspects of Spiral Inductors on Silicon", J.N. Burghartz et al., IEEE Jrnl. of Solid–State Circuits, vol. 33, No. 12, pp. 246–247, Dec. 1998.

(Continued)

*Primary Examiner*—Tuyen T Nguyen
(74) *Attorney, Agent, or Firm*—George D. Saile; Rosemary L. S. Pike (57) ABSTRACT

A method of fabricating an inductor using bonding techniques in the manufacture of integrated circuits is described. Bonding pads are provided over a semiconductor substrate. Input/output connections are made to at least two of the bonding pads. A plurality of wire bond loops are made between each two of the bonding pads wherein the plurality of wire bond loops forms the inductor.

8 Claims, 8 Drawing Sheets

OTHER PUBLICATIONS

"Novel Substrate Contact Structure for High-Q Silicon Integrated Spiral Inductors," J.N. Burghartz et al., Tech. Dig. Int. Electron Devices Meeting, pp. 55–58, 1997, no date.

"Microwave Inductors and Capacitors in Standard Multilevel Interconnect Silicon Technology," J.N. Burghartz et al., IEEE Trans. on Microwave Theory & Techniques, vol. 44, No. 1, pp. 100–104, Jan. 1996.

"The Modeling, Characterization and Design of Monolithic Inductors for Silicon RF IC's," J.R. Long et al., IEEE Jrnl. of Solid-State Circuits, vol. 32, No. 3, pp. 357–368, Mar. 1997.

"Multilevel Spiral Inductors Using VLSI Interconnect Technology", J.N. Burghartz et al., IEEE Electron Device Letters, vol. 17, No. 9, pp. 428–430, Sep. 1996.

"Si IC-Compatible Inductors and LC Passive Filters," N.M. Nguyen et al., IEEE Jrnl. of Solid-State Circuits, vol. 25, No. 4, pp. 1028–1031, Aug. 1990.

"Experimental Study on Spiral Inductors," S. Chaki et al., IEEE Microwave Symp. Digest, MTT-S, pp. 753–756, 1995.

* cited by examiner

HIGH PERFORMANCE RF INDUCTORS AND TRANSFORMERS USING BONDING TECHNIQUE

This is a division of U.S. patent application Ser. No. 09/556,423, filing date Apr. 24, 2000 now U.S. Pat. No. 6,586,309, High Performance Rf Inductors And Transformers Using Bonding Technique, assigned to the same assignee as the present invention.

BACKGROUND OF THE INVENTION (1) Field of the Invention

The invention relates to a method of forming an inductor in the fabrication of integrated circuits, and more particularly, to a method of forming a high quality inductor using bonding techniques in the manufacture of integrated circuits.

(2) Description of the Prior Art

Increasing demands for wireless communications motivate a growing interest in low-cost, compact monolithic personal communication transceivers. High performance radio frequency (RF) inductors are the key components for implementing critical building blocks such as low-noise RF voltage-controlled oscillators (VCOs), low-loss impedance matching networks, passive filters, low-noise amplifiers and inductive loads for power amplifiers, etc. Critical parameters include inductance value, quality factor, and self-resonant frequency. However, the difficulty of realizing high quality factor (Q) inductors remains a challenge especially on silicon radio frequency (RF) integrated circuit (IC) applications. Conventional inductors built on silicon have strictly planar structures and using conventional fabrication processes suffers from several limitations. Most structures and methods currently used for fabricating high Q inductors are in hybrid circuits, monolithic microwave integrated circuits (MMICs), or discrete applications which are not readily compatible with silicon VLSI processing. Consequently, the ability of integrating high quality factor (high Q) inductors on active silicon is limited.

In the past, many fabricating techniques, methods, and processes were proposed to improve the performance of the integrated conductor. In fact, most of these techniques are not cost effective or practical, requiring process changes such as depositing thicker metal/dielectric layers or starting with high resistivity substrates. Expensive processes such as the selective removal of the silicon substrate underneath the inductors has been introduced to eliminate the substrate parasitic effects. However, this processing technique raises reliability issues like packaging yield and long-term mechanical stability. Also, the typical aluminum-copper (AlCu) interconnects which are found in the conventional silicon process have higher resistivity than gold (Au) metallization used in GaAs technology. This is a concern for obtaining high inductance (L) value. Another approach is to make an active inductive component which simulates the electrical properties of an inductor by active circuitry. It is possible to achieve very high Q-factor and inductance in a relatively small size this way. However, this approach may suffer from high power consumption and high noise levels that are not acceptable for high frequency applications.

Most of these complex processes used seem promising, but they are uncommon to most semiconductor processes and they will result in high production costs. Currently, the conventional spiral inductor is still the most commonly used. This spiral inductor which is built horizontally on the substrate surface not only occupies large chip area, but also suffers from low Q-factor and high parasitic effects due to substrate losses.

A number of papers have discussed the use of inductors for new device technologies such as RF devices. The first two references listed provide more general discussions of inductors while the remaining papers discuss spiral inductors. Refer to: (1) "New Development Trends for Silicon RF Device Technologies," by N. Camilleri et. al, IEEE Microwave and Millimeter-Wave Monolithic Circuits Symposium, p. 5–8, 1994; (2) "Future Directions in Silicon IC's for RF Personal Communications," by P. R. Gray et al, Proc. Custom Integrated Circuits Conference, p. 83–89, 1995; (3) "High Q CMOS-Compatible Microwave Inductors Using Double-Metal Interconnection Silicon Technology," IEEE Microwave and Guided Wave Letters, Vol. 7, No. 2, p. 45–47, February 1997; (4) "RF Circuit Design Aspects of Spiral Inductors on Silicon," by J. N. Burghartz et al, IEEE Journal of Solid-State Circuits, Vol. 33, No. 12, p. 246–247, December 1998; (5) "Novel Substrate Contact Structure for High-Q Silicon Integrated Spiral Inductors," by J. N. Burghartz et al, Tech. Dig. Int. Electron Devices Meeting, p. 55–58, 1997; (6) "Microwave Inductors and Capacitors in Standard Multilevel Interconnect Silicon Technology," by J. N. Burghartz et al, IEEE Transactions on Microwave Theory and Techniques, Vol. 44, No. 1, P. 100–104, January 1996; (7) "The Modeling, Characterization and Design of Monolithic Inductors for Silicon RF IC's", by J. R. Long et al, IEEE Journal of Solid-State Circuits, Vol. 32, No. 3, p. 357–368, March 1997; (8) "Multilevel Spiral Inductors Using VLSI Interconnect Technology," by J. N. Burghartz et al, IEEE Electron Device Letters, Vol. 17, No. 9, p. 428–430, September 1996; (9) "Si IC-Compatible Inductors and LC Passive Filters," by N. M. Nguyen et al, IEEE Journal of Solid-State Circuits, Vol. 25, No. 4, p. 1028–1031, August 1990; (10) "Experimental Study on Spiral Inductors," by S. Chaki et al, IEEE Microwave Symp. Dig. MTT-S, p. 753–756, 1995.

U.S. Pat. No. 5,886,393 to Merrill et al teaches forming an inductor in a package form using bonding wire segments. The inductor can have any shape. U.S. Pat. No. 5,963,110 to Ihara et al shows an inductor formed on a ceramic substrate using bonding wire divided into sections and having daisy-chained connections across landing pads. U.S. Pat. No. 5,905,418 to Ehara et al, U.S. Pat. No. 5,945,880 to Souetinov and U.S. Pat. No. 5,640,127 to Metz disclose inductors formed in whole or in part of bonding wire.

SUMMARY OF THE INVENTION

A principal object of the present invention is to provide an effective and very manufacturable method of forming a high quality inductor in the fabrication of integrated circuit devices.

Another object of the invention is to provide a method of fabricating an inductor using bonding techniques in the manufacture of integrated circuits.

A further object of the invention is to fabricate using bonding techniques a high quality inductor that operates at high frequency.

Yet another object is to fabricate using bonding techniques a high quality inductor that operates at high frequency wherein this fabrication is suitable for VLSI integration at low cost.

In accordance with the objects of this invention a method of fabricating an inductor using bonding techniques in the manufacture of integrated circuits is achieved. Bonding pads are provided over a semiconductor substrate. Input/output connections are made to at least two of the bonding pads. A plurality of wire bond loops are made between each two of the bonding pads wherein the plurality of wire bond loops forms the inductor.

Also in accordance with the objects of the invention, an inductor comprising wire bonds is achieved. Bonding pads are formed on a semiconductor substrate. The inductor comprises a plurality of wire bond loops connecting each two of the bonding pads. Input/output connections are made to at least two of the bonding pads.

BRIEF DESCRIPTION OF THE DRAWINGS

In the accompanying drawings forming a material part of this description, there is shown.

DESCRIPTION OF THE PREFERRED EMBODIMENTS

Figure 1A:
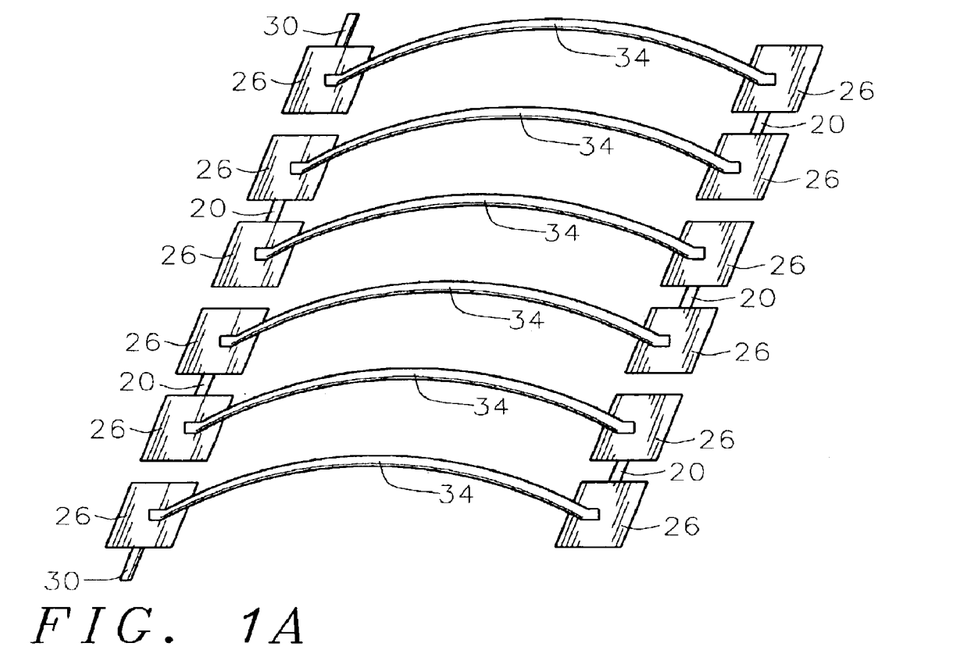
FIGS. 1a and 1b schematically illustrate in side view and in plan view, respectively, a preferred embodiment of a meander-shaped inductor of the present invention.
Figure 1B:
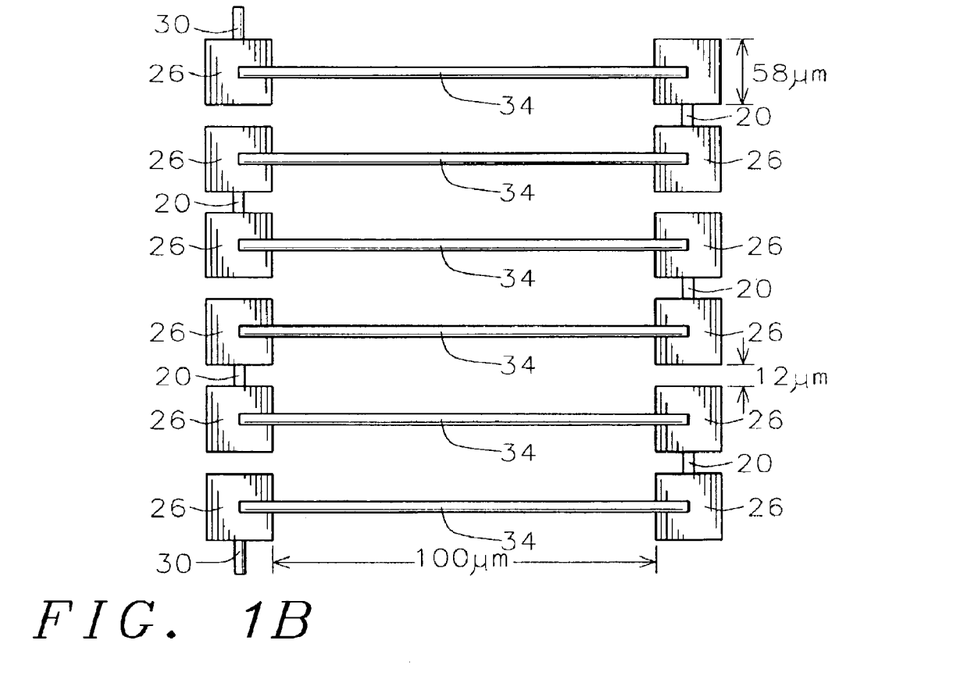
Figure 3A:
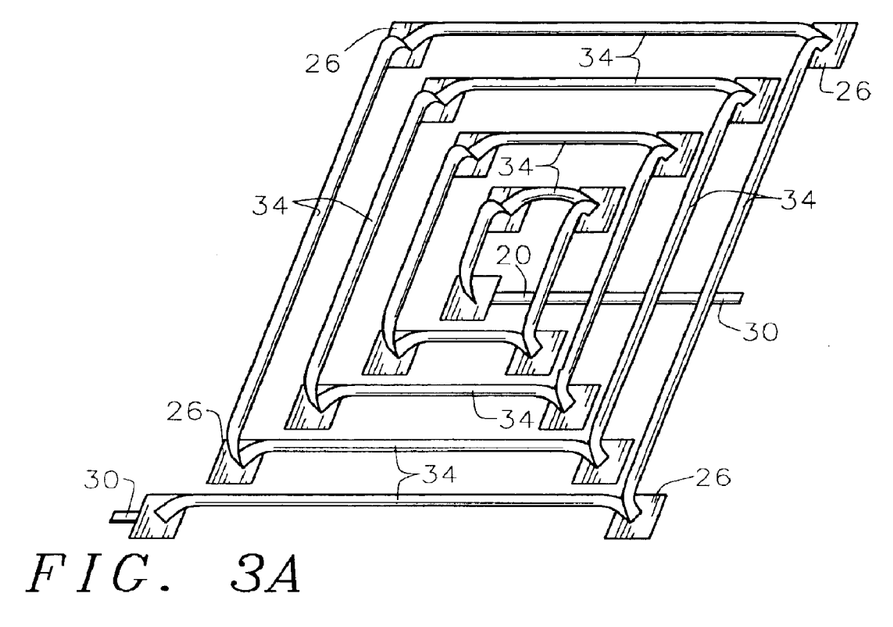
FIGS. 3a and 3b schematically illustrate in side view and in plan view, respectively, a preferred embodiment of a spiral inductor of the present invention.
Figure 3B:
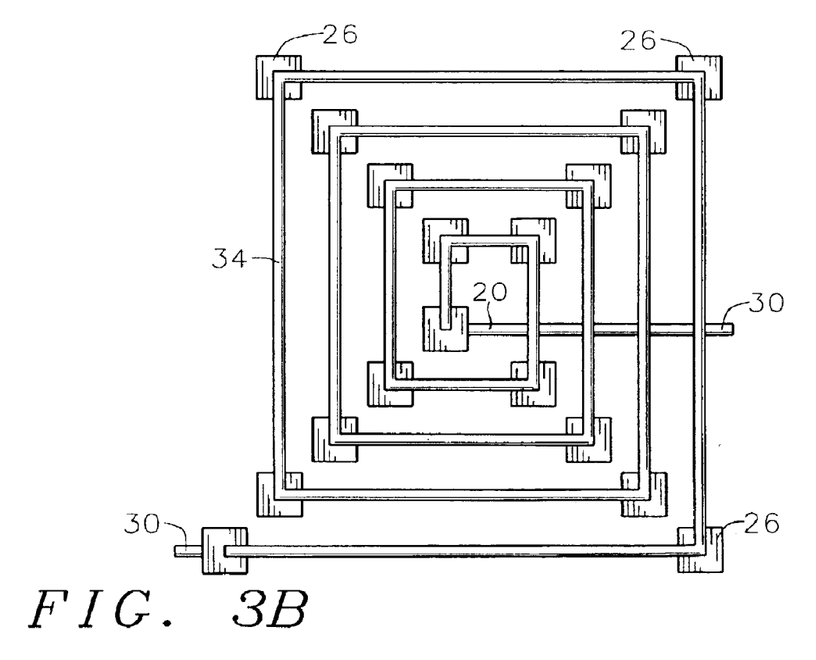
Figure 5A:
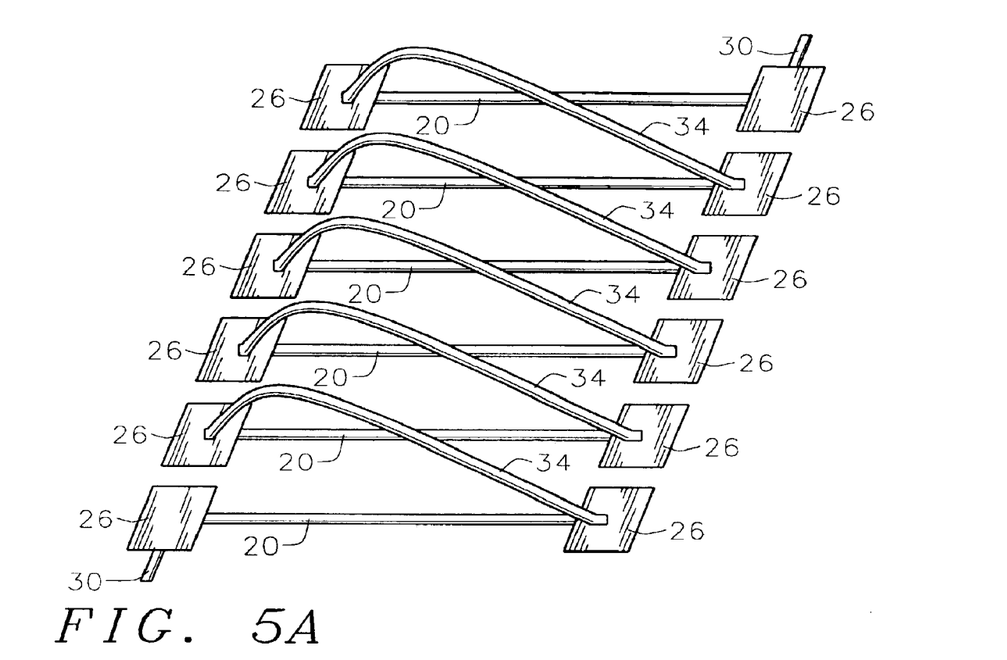
FIGS. 5a and 5b schematically illustrate in side view and in plan view, respectively, a preferred embodiment of a solenoid inductor of the present invention.
Figure 5B:
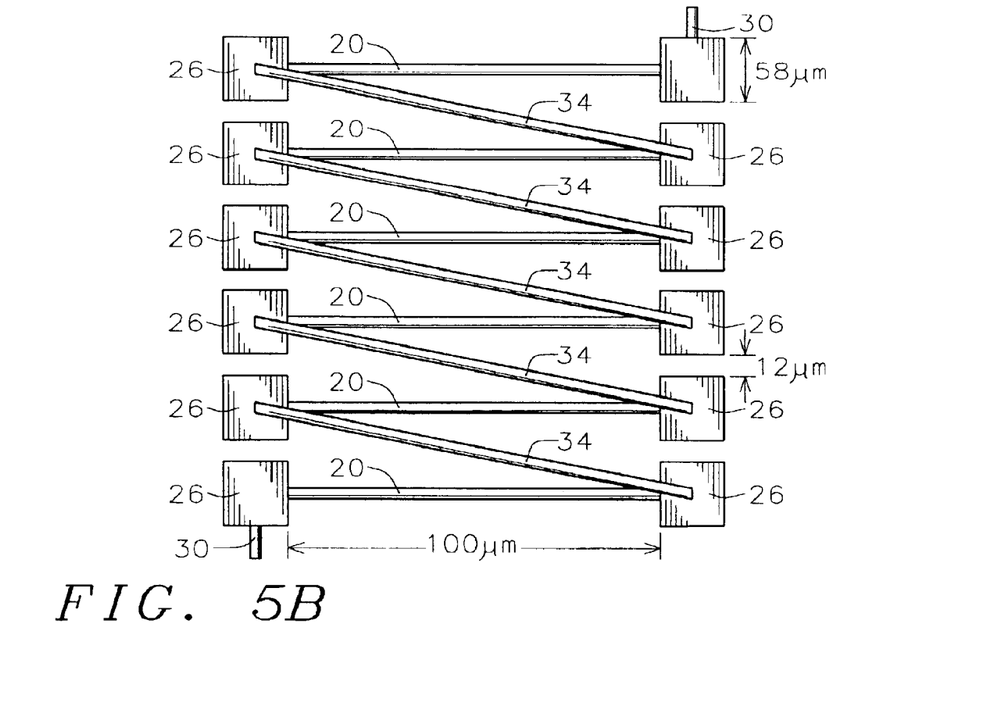

Existing integrated inductors have low quality factors and low inductance values and they occupy large area spaces. The proposed integrated inductor using bonding techniques, as illustrated in FIGS. 1, 3, and 5, is able to overcome these problems with the use of current semiconductor IC processing.

Currently, there are three types of bonding methods that are used for high-density VLSI packaging: the thermocompression, thermosonic, and ultrasonic wedge. Each bonding method has its own advantages and disadvantages. Each method can be used in the process of the present invention. All result in a high quality performance inductor of the present invention. The manufacturing yield and tolerance can be easily controlled by off-the-shelf automatic wire bonding machines with loop control capability which are used for high density VLSI packaging. Circular bond wire loops with a minimum 65 µm separation can be repeatedly manufactured within few percentage geometrical variations using the polygonal movement of a wire bonding machine. Loop heights are also controllable.

The inductor of the present invention can be fabricated in Very Large Scale Integration (VLSI) and Ultra Large Scale Integration (ULSI) designs for all semiconductor material; e.g. in silicon-based RF integrated circuits and in GaAs MMIC's. The vertical placement of the bond wire loop separates the electromagnetic fields from the conductive substrate and this effectively reduces the substrate effects. Also, the bond wire has a wide cross-section and long periphery, resulting in negligible ohmic resistance. Small parasitic capacitance with the ground plane is also achieved. With all of these positive conditions, the bond wire is an excellent loop conductor for high quality factor and self-resonant frequency on chip inductors. It is obvious that this technique will not only satisfy the fundamental requirements of semiconductor manufacturing, but also reduce production cost over the complex processes discussed in reference to the prior art.

Conventional IC processing is completed, including the fabrication of normal bonding pads. Now, the inductor of the present invention is to be fabricated. For example, FIG. 1a illustrates in side view a meander-shaped inductor of the present invention. Top conductive lines 20 are illustrated along with bonding pads 26. It will be understood that semiconductor device structures, not shown, may underlie and be connected to the top conductive lines. Input/output connections 30 have been made to two of the bonding pads 26, as shown. FIG. 1b illustrates the same inductor in plan view.

The individual inductor loop 34 consists of, for example, a 100 µm wide horizontal strip (this dimension can be varied) with, for example, 58 µm by 58 µm bonding pad size and a 12 µm pad-to-pad spacing, as shown in FIG. 1b. These dimensions can be varied depending upon the design rule and are given for illustration purposes only.

The bond wire inductor of the present invention has a wider range of inductance variations due to the loop numbers. That is, the more loops used in the inductor, the higher the inductance. The magnetic flux linkage between the bond wire loops 34 is more efficient than that of spiral conductors where the horizontal geometry of the spiral inductors limits the flux linkage to the smaller internal loops. The bond wire inductor of the present invention also has smaller parasitic capacitance between the loops and the ground plane because the bond wires are separated from the silicon surface. Therefore, self-resonant frequencies of the bond wire inductors are higher than those of the spiral inductors. The associated frequency dependence is also improved in the inductor of the invention.

The material of the bond wires 34 can be either copper or gold which have very low series resistance and are therefore excellent options for inductors.

One minor limitation of this design is the use of the top metal conductor strips 20 that connect the bond wires to form the inductor. At high frequency, due to the skin effect (i.e., the current is confined to flow only at the surface of the conductor at high frequency), the ohmic strip resistance of the metal will be increased by the square root of the frequency. Fortunately, this limiting electrical performance can be improved by replacing the strip conductors with wedge bond wires. This will effectively increase the quality factor. The wedge bond wire with the rotary head can form low profile short interconnections. Using only bond wires to form the inductor of the invention results in an inductor having very low ohmic resistance and, consequently, a greatly improved quality factor. No change is required to the normal VLSI process in making the inductor of the present invention.

FIG. 3a illustrates in side view and FIG. 3b illustrates in plan view a spiral inductor made using the bonding technique of the present invention. Top conducting strip 20, bonding pads 26, input/output connections 30, and bonding wire 34 are shown as in FIGS. 1a and 1b. The fabrication techniques are the same in this embodiment. The only difference is in the shape of the inductor.

Likewise, FIG. 5a illustrates in side view and FIG. 5b illustrates in plan view a solenoid inductor made using the bonding technique of the present invention. Top conducting strip 20, bonding pads 26, input/output connections 30, and bonding wire 34 are shown as in FIGS. 1a and 1b. The fabrication techniques are the same in this embodiment. The only difference is in the shape of the inductor.

It will be understood by those skilled in the art that the present invention is not limited to those embodiments shown in the drawing figures. The figures show only three of the many possible inductor shapes that can be made using the process of the invention. Many other inductor shapes can be made (for example hexagon, octagon, circular, triangular, etc) without departing from the spirit and scope of the present invention.

The inductor of the present invention is manufactured using current existing bonding techniques which has been cleverly applied and integrated into the present and future VLSI technology.

Figure 2A:
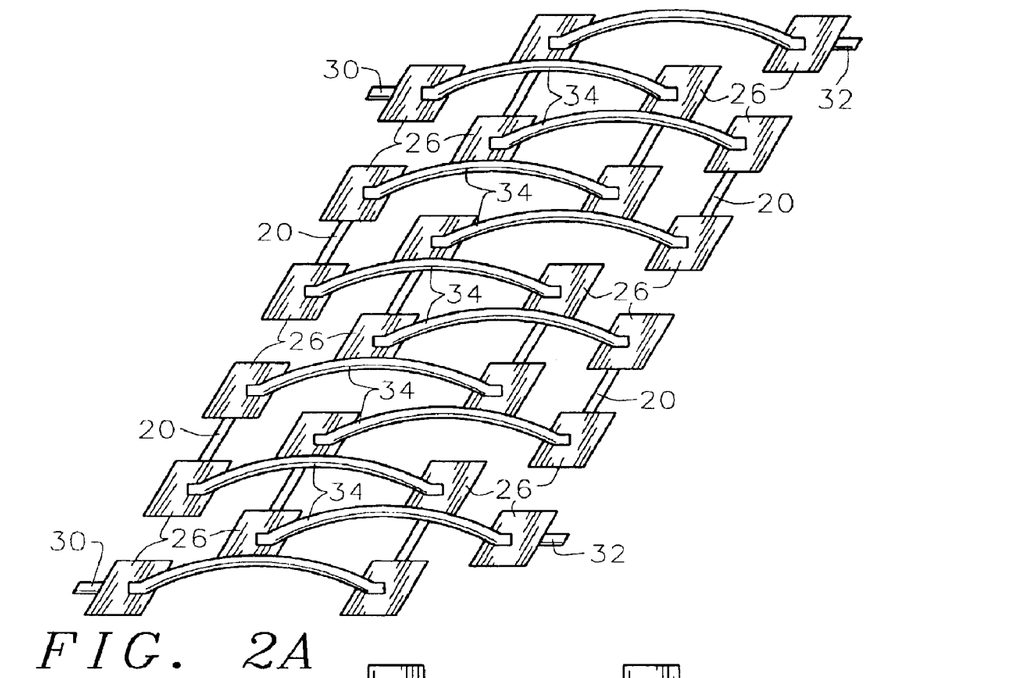
FIGS. 2a and 2b schematically illustrate in side view and in plan view, respectively, a preferred embodiment of a meander-shaped transformer of the present invention.
Figure 2B:
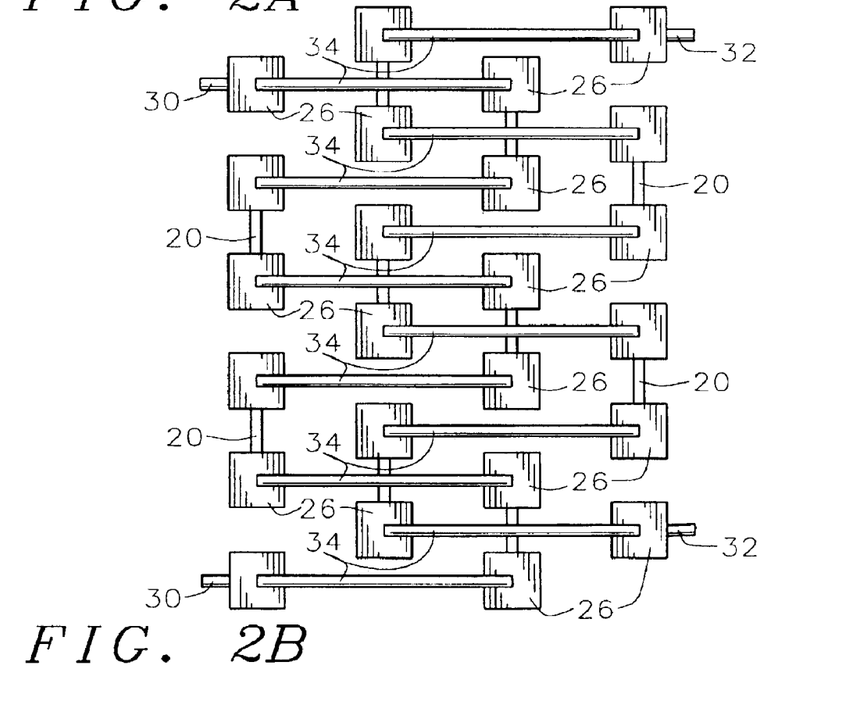
Figure 4A:
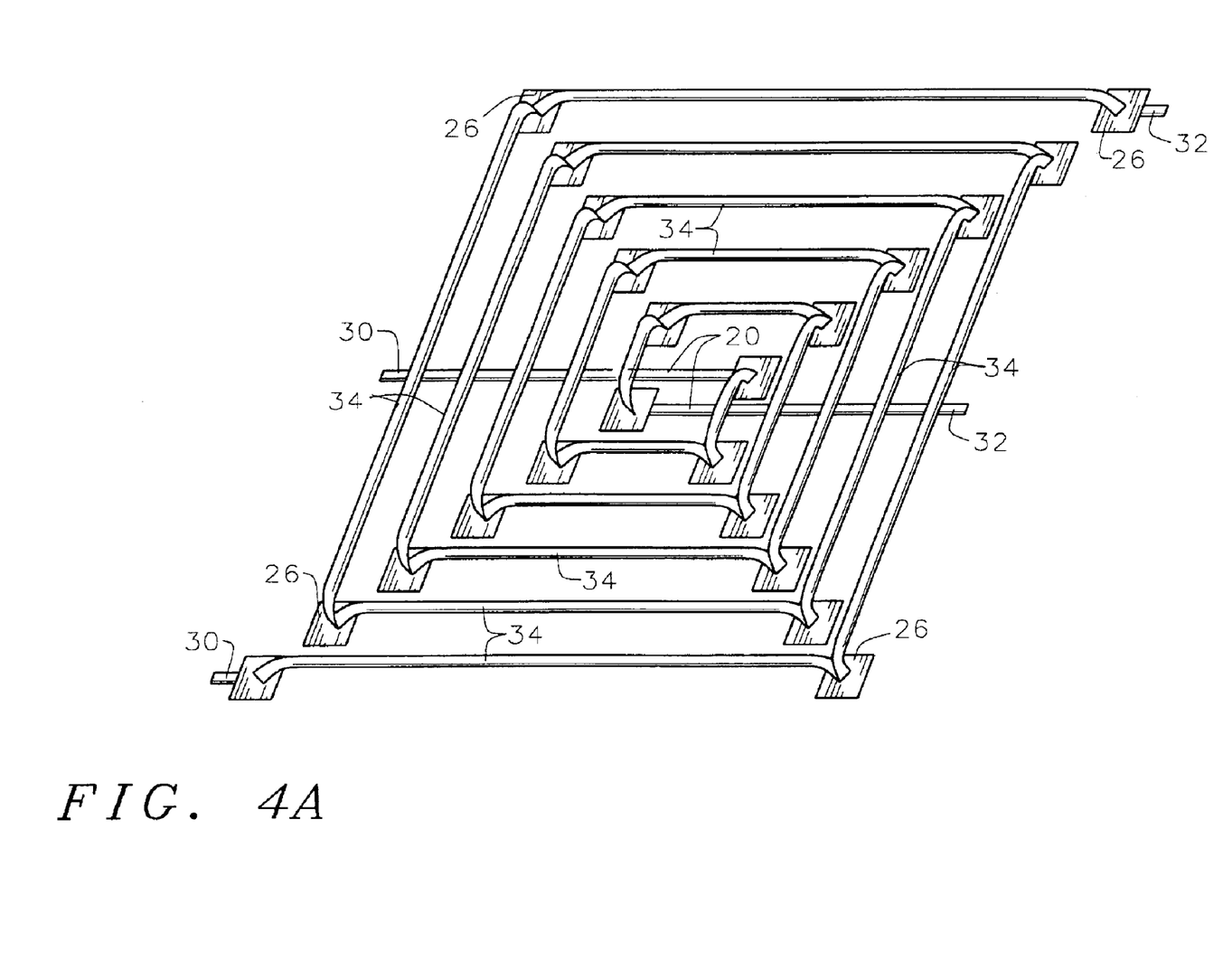
FIGS. 4a and 4b schematically illustrate in side view and in plan view, respectively, a preferred embodiment of a spiral transformer of the present invention.
Figure 4B:
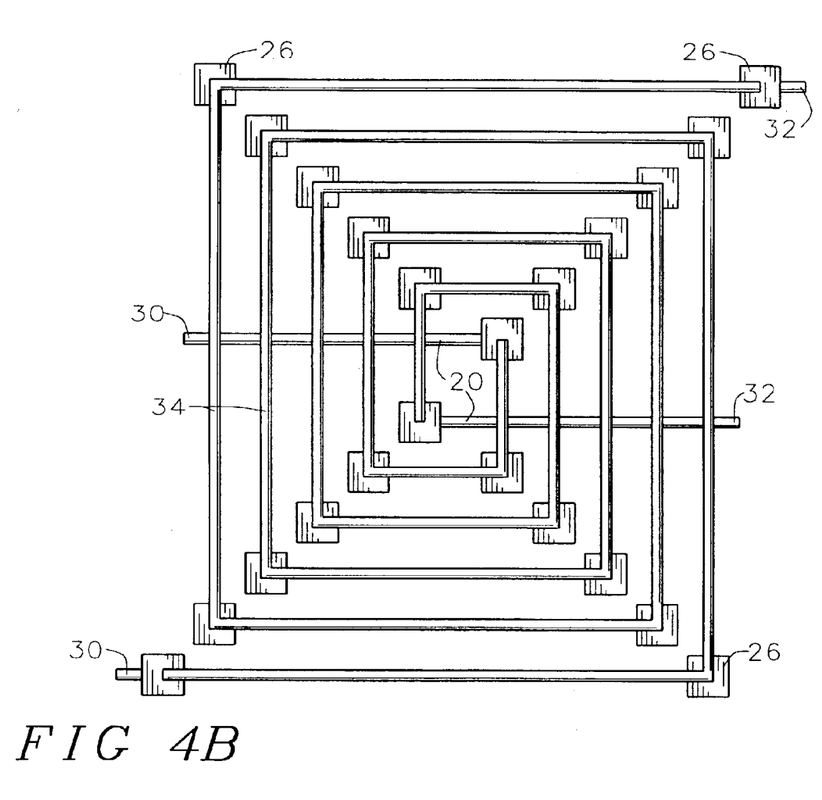
Figure 6A:
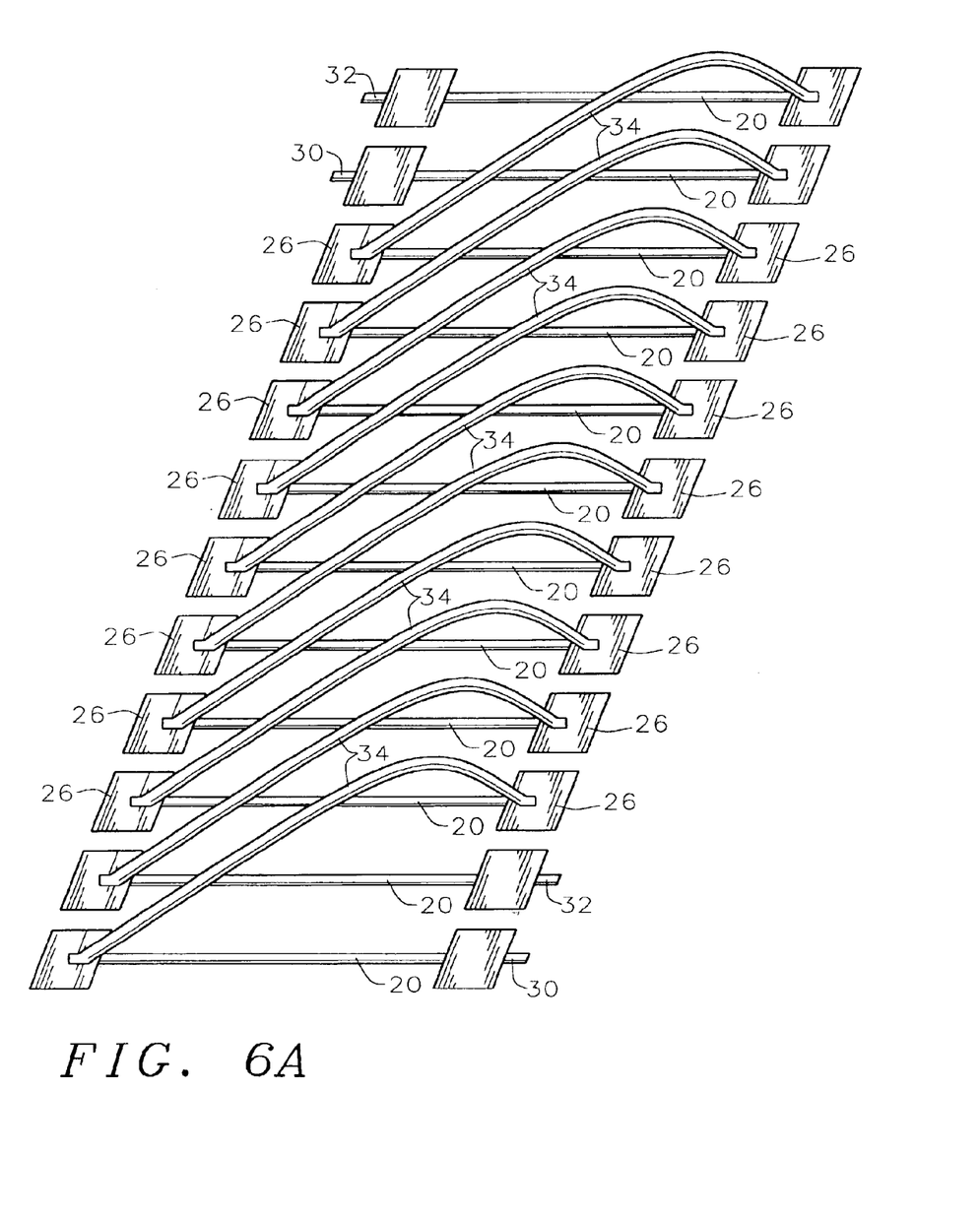
FIGS. 6a and 6b schematically illustrate in side view and in plan view, respectively, a preferred embodiment of a solenoid transformer of the present invention.
Figure 6B:
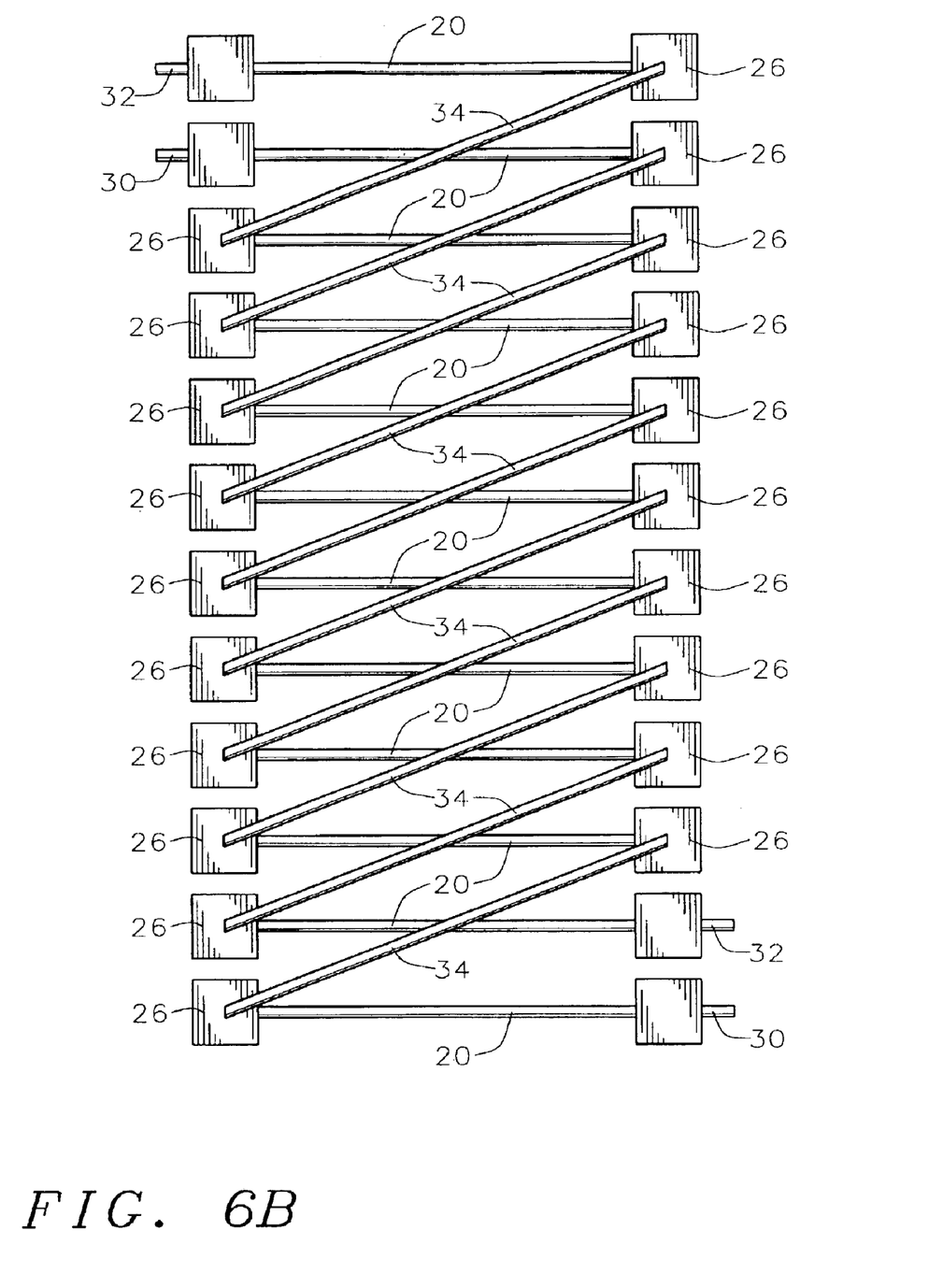

The wire bond inductor of the present invention can be further designed into the on-chip transformers. FIGS. 2a and 2b show a meander-shaped transformer, in side view and plan view, respectively. The first input/output connections 30 of a first inductor are shown. The second input/output connections 32 of a second inductor are shown. THe two inductors together form the transformer. FIGS. 4a and 4b show a spiral transformer and FIGS. 6a and 6b show a solenoid transformer. These miniaturized high performance transformers will have significant contributions to the current VLSI and ULSI integration process. The design of the transformer is based on integrating two inductors. While the inductor has two input/output connections, a transformer has four.

The on-chip inductor of the present invention fabricated using bonding techniques provides high quality factor performance and low cost for all semiconductor materials. The high quality inductor of the invention will play an important role especially in developing high performance silicon radio frequency integrated circuits (RF ICs) and microwave monolithic integrated circuits (MMICs). The bonding technique of the present invention can be used for any shape and size of inductors and transformers.

While the invention has been particularly shown and described with reference to the preferred embodiments thereof, it will be understood by those skilled in the art that various changes in form and details may be made without departing from the spirit and scope of the invention.

What is claimed is:

1. A wire bond inductor comprising:
   semiconductor device structures in and on a semiconductor substrate;
   bonding pads overlying said semiconductor device structures;
   wedge bond wires underlying and connecting said bonding pads;
   input/output connections to two of said bonding pads; and
   a plurality of bond wire loops, each loop connecting each two of said bonding pads wherein said bond wire loops form said inductor.

2. The wire bond inductor according to claim 1 wherein said bond wire loops comprise copper or gold.

3. The wire bond inductor according to claim 1 wherein said inductor has a meander, spiral, or solenoid shape.

4. A wire bond inductor comprising:
   semiconductor device structures in and on a semiconductor substrate;
   bonding pads overlying said semiconductor device structures;
   wedge bond wire underlying and connecting said bonding pads;
   input/output connections to two of said bonding pads; and
   a plurality of bond wire loops, each loop connecting each two of said bonding pads wherein said bond wire loops form said inductor and wherein said inductor has a meander, spiral, or solenoid shape.

5. The wire bond inductor according to claim 4 wherein said bond wire loops comprise copper or gold.

6. A transformer comprising:
   bonding pads over a semiconductor substrate;
   wedge bond wire underlying and connecting said bonding pads;
   first input/output connections to two of said bonding pads;
   second input/output connections to another two of said bonding pads; and
   a plurality of bond wire loops, each loop connecting each two of said bonding pads wherein said bond wire loops connecting to said first input/output connections form a first inductor and wherein said bond wire loops connecting to said second input/output connections form a second inductor and wherein said first and second inductors together form said transformer.

7. The transformer according to claim 6 wherein said bond wire loops comprise copper or gold.

8. The transformer according to claim 6 wherein said first and second inductors have a meander, spiral, or solenoid shape.

* * * * *